United States Patent [19]

Chang

[11] Patent Number: 5,182,647
[45] Date of Patent: Jan. 26, 1993

[54] HIGH RESOLUTION CHARGE-COUPLED DEVICE (CCD) CAMERA SYSTEM

[75] Inventor: Win-Chyi Chang, Penfield, N.Y.

[73] Assignee: Eastman Kodak Company, Rochester, N.Y.

[21] Appl. No.: 627,136

[22] Filed: Dec. 13, 1990

[51] Int. Cl.$^5$ .............................................. H04N 5/335
[52] U.S. Cl. ........................... 358/213.11; 358/213.28; 358/213.16; 358/213.23; 358/213.31
[58] Field of Search ....................... 358/213.11, 213.16, 358/213.17, 213.23, 213.25, 213.28, 213.31; 357/24 LR, 24 M

[56] References Cited

U.S. PATENT DOCUMENTS

| | | | |
|---|---|---|---|
| 3,931,465 | 1/1976 | Levine | 178/7 1 |
| 4,328,432 | 5/1982 | Yamazaki | 357/24 LR |
| 4,481,522 | 11/1984 | Jastrzebski et al. | 357/24 |
| 4,485,315 | 11/1984 | Collet et al. | 307/311 |
| 4,571,626 | 2/1986 | Yamada | 358/213.19 |
| 4,575,751 | 3/1986 | Duschl | 358/213.11 |
| 4,621,369 | 11/1986 | Narabu | 357/24 M |
| 4,647,976 | 3/1987 | Nakagaki | 358/213.31 |
| 4,663,771 | 5/1987 | Takeshita et al. | 377/58 |
| 4,739,409 | 4/1988 | Baumeister | 358/213.19 |
| 4,769,710 | 9/1988 | Uchida | 358/213.31 |
| 4,831,454 | 5/1989 | Tanaka | 358/213.31 |
| 4,908,709 | 3/1990 | Inuiya | 358/213.16 |
| 4,912,558 | 3/1990 | Easterly | 358/213.16 |

FOREIGN PATENT DOCUMENTS 55-44712 3/1980 Japan.
0139170 6/1986 Japan.

OTHER PUBLICATIONS

W. F. Kosonocky et al., "Control of Blooming in Charge-Coupled Imagers", RCA Review, vol. 35, Mar., 1984, pp. 3-24.

Primary Examiner—Victor R. Kostak
Assistant Examiner—Sherrie Hsia
Attorney, Agent, or Firm—Stephen C. Kaufman

[57] ABSTRACT

The present invention is a high resolution charge-coupled device (CCD) camera system having a CCD camera which is capable of operating at a low data rate (e.g., 1 to 2.5 MHz) that is compatible with the input data rate of a computer. An output of the CCD camera is coupled through an analog-to-digital converter (A/D) to an input of the computer which receives and analyzes the output of the camera. The CCD camera contains a CCD image sensor which is a two phase sensor capable of operating in a mode where holes are accumulated at room temperature so as to reduce the dark current generated in the sensor. Thus, the CCD camera system is of simple construction so as to be relatively inexpensive and can operate at room temperature with reduced dark current.

5 Claims, 3 Drawing Sheets

HIGH RESOLUTION CHARGE-COUPLED DEVICE (CCD) CAMERA SYSTEM

FIELD OF THE INVENTION

The present invention relates to a high resolution charge-coupled device (CCD) camera system, and, more particularly, to such a camera system which operates at room temperature with a reduction in dark current.

BACKGROUND OF THE INVENTION

High resolution CCD cameras with a large number of pixels (e.g., one million or more) are used for many scientific and industrial applications. In the use of these cameras, the output of the camera is generally fed into a computer whose output is fed to a monitor. The computer allows for analyzing the information and providing any part or all of the information to be fed in any form to the monitor. A typical camera of this type, for example a Videk Megaplus camera, has a low dynamic range, about 8 bits, and a high data rate, about 10 MHz. However, most computers cannot accept information at this high rate. Therefore, it has been necessary to first digitize the data from the camera and store it in a frame buffer at the 10 MHz data rate. The information is then transferred from the buffer to the computer at a slower rate which is compatible with the acceptance rate of the computer. This both increases the cost of the system in the need for the buffer, and slows down its operation.

In an attempt to eliminate the buffer from the camera system, CCD cameras have been built that operate at low data rates, 50-500 KHz, to obtain 12-14 bits of dynamic range. The data can then be read directly into the computer. However, at these slow rates it takes a long time, about 8 seconds, to read out a high resolution camera. As a result, at room temperature, the CCD sensor of the camera if filled with dark charges which adversely affect the picture obtained. In order to reduce the dark charges in such a slow CCD high resolution camera, it has been necessary to thermoelectrically cool the CCD sensor, typically to $-40°$ C. For this purpose, the CCD sensor head is placed in an evacuated housing to prevent condensation from forming on the CCD sensor as a result of the cooling. This greatly increases the size and cost of the camera. Therefore, it is desirable to have a high resolution CCD camera system which can operate at a speed compatible with the data input speed limitation of a computer so as to eliminate the need for an expensive buffer, yet will operate at room temperature with reduced dark current so as to eliminate the need for special cooling means.

SUMMARY OF THE INVENTION

The present invention is directed to a high resolution charge-coupled (CCD) camera system in which the CCD sensor is capable of operating in a mode where holes are accumulated to reduce any dark current at room temperature. When operating in this mode the sensor can operate at lower speeds at room temperature with reduced dark current. The camera can then be coupled to a computer without the need of costly buffers.

More particularly, the present invention is directed to a high resolution CCD camera system which comprises a CCD sensor having a plurality of pixels and which is capable of operating in the mode where holes are accumulated at room temperature to reduce any dark current. A computer is provided which is adapted to receive and analyze the information for the CCD sensor and is coupled to an output of the CCD sensor.

The invention will be better understood from the following more detailed description taken with the accompanying drawings.

It should be understood that the drawings are not necessarily drawn to scale.

DETAILED DESCRIPTION

Figure 1:
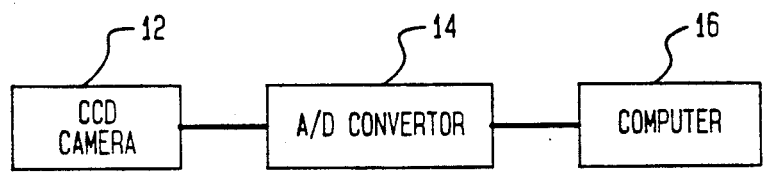
FIG. 1 is a schematic circuit diagram of the CCD camera system in accordance with the present invention.

Referring now to FIG. 1, there is shown a schematic circuit diagram of the high resolution charge-coupled device (CCD) camera system 10 of the present invention. Camera system 10 comprises a high resolution CCD camera 12 having a CCD image sensor which operates in the accumulation mode at room temperature (e.g., 68° F.). The camera 12 is coupled through an A/D converter 14 to a computer 16 which can analyze the signal information from the camera 12. A high resolution CCD camera is one in which the CCD image sensor has a large number of pixels, for example, one million or more. Such a camera can be operated in the 1 to 2.5 MHz data range so as to permit the camera to be read directly into a computer without the need of an expensive frame buffer. By using a CCD image sensor which operates in the mode of operation where holes are accumulated at room temperature the dark current is greatly reduced, for example by a factor of 50 to 100, so that the dark current does not adversely affect the picture produced by the camera.

Figure 2:
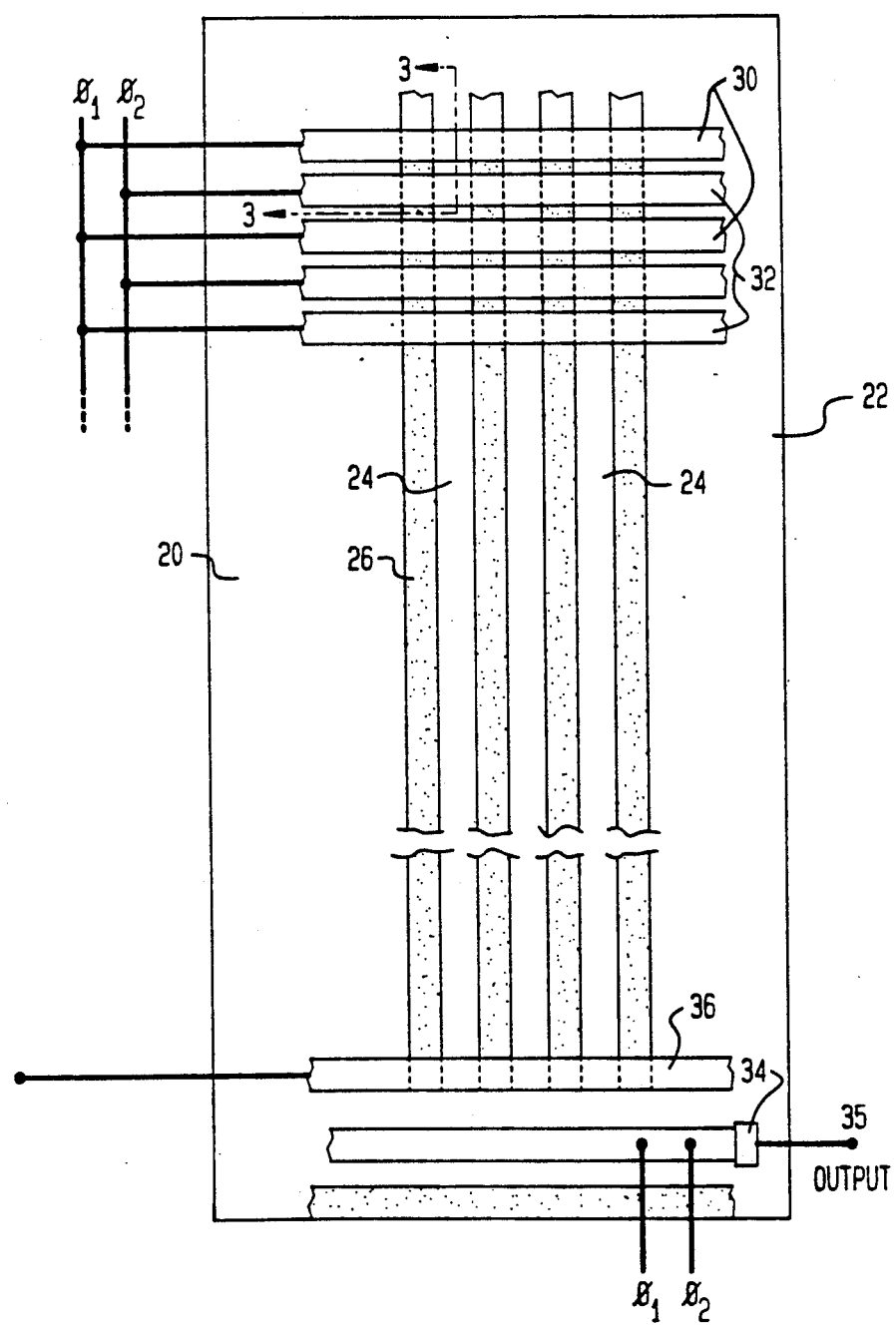
FIG. 2 is a schematic plan view of a two phase area image sensor which can be used in the CCD system of FIG. 1.
Figure 3:
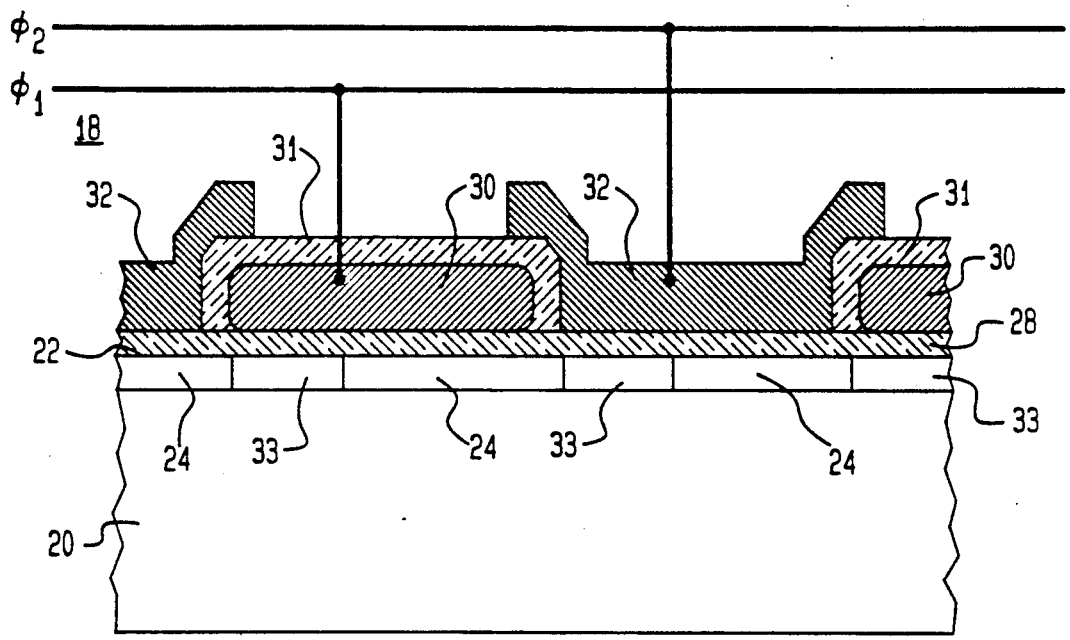
FIG. 3 is a sectional view along line 3—3 of FIG. 2.

Referring now to FIGS. 2 and 3, there is shown a top plan view and a sectional view, respectively, of a CCD image sensor 18 which can be operated in the above described mode. This CCD image sensor and its operation are described in greater detail in the copending patent application of Bruce Burkey et al., Ser. No. 402,735, filed Sep. 5, 1989, entitled "Reduced Dark Current in Charge Coupled Device" and assigned to the same assignee as the present application. The CCD image sensor 18 is a frame transfer CCD image sensor which comprises a substrate 20 of a semiconductor material, such as single crystalline silicon, of one conductivity type, typically p-type. A plurality of spaced, parallel charge transfer channels 24 extend in a vertical direction along a surface 22 of the substrate 20. As shown in FIG. 3, each of the channels 24 is a region of n-type conductivity in the substrate 20 and extending along the surface 22. Separating adjacent transfer channels 24 are channel stops 26 which prevent charge leakage between adjacent channels 24. Although not shown, each of the channel stops typically is a region of the same conductivity type as the substrate 20 but of higher conductivity, such as p+ type, in the substrate and extending along the surface 22.

On the surface 22 of the substrate 20 is a layer 28 of an insulating material, typically silicon dioxide. On the silicon dioxide layer 28 and extending transversely across the channels 24 are a plurality of spaced apart first gates (conductors) 30. Also on the silicon dioxide layer 28 and extending transversely across the channels 24 are a plurality of spaced apart second gates (conductors) 32. The first and second gates 30 and 32 alternate along the length of the channels 24. The first and second gates 30 and 32 are of a transparent conductive material, such as doped polycrystalline silicon. Each of the first gates 30 is covered with a layer 31 of an insulating material, typically silicon dioxide, which insulates each of the first gates 30 from its adjacent second gates 32. Each vertical transfer channel 24 is defined into a plurality of sensing elements or image pixels, each of which is defined by a pair of adjacent first and second gates 30 and 32. Thus, each pixel has two gates to form a two phase CCD device. As shown in FIG. 3, each transfer channel 24 has a region 33 under each of the gates 30 and 32 which is more lightly doped than the remaining portion of the transfer channel 24 and forms the transfer regions of the transfer channel 24. The remaining portion of the transfer channel 24 under each gate 30 and 32 is a storage region.

A horizontal CCD shift register 34 extends across the ends of the vertical CCD transfer channels 24 to an output 35. A gate 36 extends horizontally across the ends of the vertical transfer channels 24 adjacent the horizontal shift register 34 and is adapted to transfer charge from the vertical transfer channels 24 to the horizontal shift register 34.

The CCD image sensor 18 is a frame transfer true two phase CCD having voltage phase lines $O_1$ and $O_2$ and buried channels 24. The first set of gates 30 are connected to the phase line $O_1$ and the second set of gates 32 are connected to the phase line $O_2$. When the pixels of the transfer channels 24 are exposed to the incident light from the image being sensed, the light is absorbed in the pixels and converted to charge carriers. Voltage signals are sequentially applied to the phase lines $O_1$ and $O_2$ to move the charge carriers in the pixels, one row at a time, along the vertical transfer channels 24 toward the horizontal shift register 34. A transfer signal applied to the transfer gate 36 transfers a row of the charge carriers to the horizontal shift register 34. The horizontal shift register 34 is also a two phase transfer device and has two set of gates, not shown, which are connected to the two phase lines. By sequentially applying a voltage to the gates of the horizontal shift register 34, the charge carriers are moved along the shift register 34 to the output of the device.

In a buried channel CCD, such as the CCD sensor 12, dark current arises from three main sources: (1) generation from a mid-gap state resulting from either the disrupted lattice or an impurity at a depleted Si—SiO$_2$ interface, (2) generation in the depletion region as a result of an impurity or defect with a mid-gap state, and (3) diffusion of minority carriers to the buried channel from the substrate. All three sources result in spurious charges being collected as signals in the buried channel.

Figure 4:
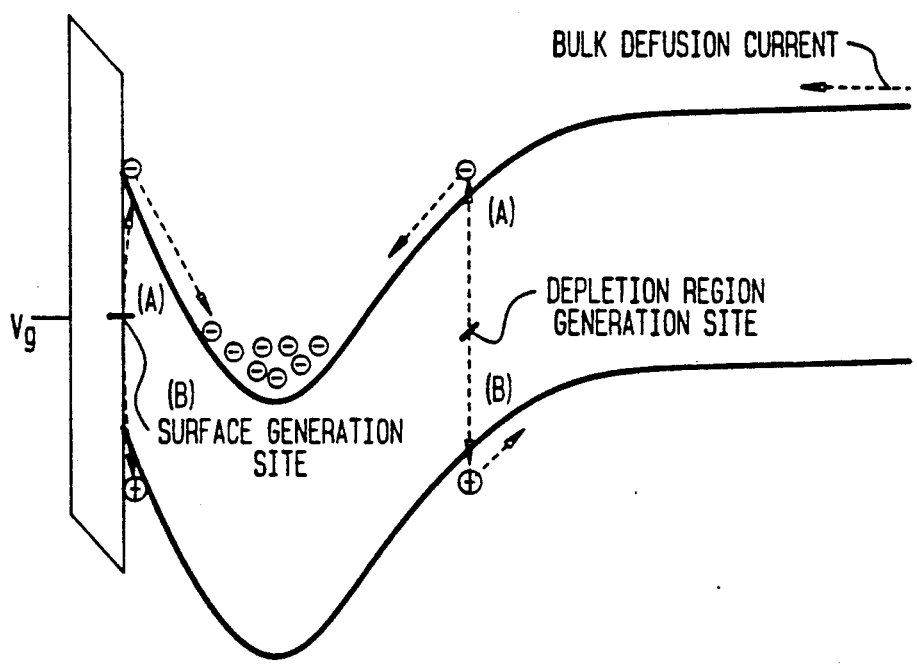
FIG. 4 is an electrostatic potential band diagram for the image pixel of a CCD sensor of the type shown in FIG. 3 illustrating the mechanism for the generation of dark current.

Referring to FIG. 4, which is an electrostatic potential band diagram for an image pixel of the CCD sensor 18, there is illustrated the mechanism for dark current generation both at the surface and in the depletion region of the CCD sensor 18. A generation site (defect) emits an electron (negative charge) into the conduction band in the buried channel and a hole (positive charge) into the valence band. In both cases, the electron is captured by the buried channel as a dark signal, and if the spatial region where the hole is emitted to the valence band is depleted of majority carriers, then the holes will migrate away from their point of generation, thus leaving the region depleted of majority carriers. A hole generated in the depletion region is driven to the substrate. A hole generated at the surface goes laterally to a channel stop region, again leaving the surface depleted of majority carriers. Since the state of the generation regions is now exactly the same as before, the electron and hole emission events, the surface and depletion region defects continue to generate electron and hole pairs, thus acting as sources of dark current. This generation process ceases only if an excess of either electrons or holes develop in the region where the defect exists. Since modern fabrication technology has greatly reduced the concentrations of both defects in the depletion region and also defects leading to bulk current, the surface state generation mechanism is the dominant source of dark current in buried channel CCDs.

Operating CCD sensor 18 in the a mode where holes are accumulated at the Si—SiO$_2$ interface greatly reduces the dark current even when the sensor 18 is operated at room temperature. The generation of dark current due to surface generation sites can be significantly reduced if a voltage is applied to a gate to accumulate holes under the gate. The accumulation of holes at the Si—SiO$_2$ interface suppresses further generation of dark current and can be understood as driving the reaction of producing electron hole pairs (previously discussed) in the reverse direction, i.e., hole capture by the defect rather than hole emission from the defect. The state of accumulation of holes at the Si—SiO$_2$ interface beneath any CCD phase gate can be controlled by the voltage, Vg, applied to the gate. As is well known in the physics of semiconductors, the hole density in the valence band is determined by the separation of the Fermi level, $E_F$, from the valence band, $E_v$. The density of holes increases dramatically when that separation becomes less than approximately ¼ the band gap, i.e., the separation between $E_v$ and $E_c$. The separation is controlled by the gate voltage, $V_G$.

Figure 5:
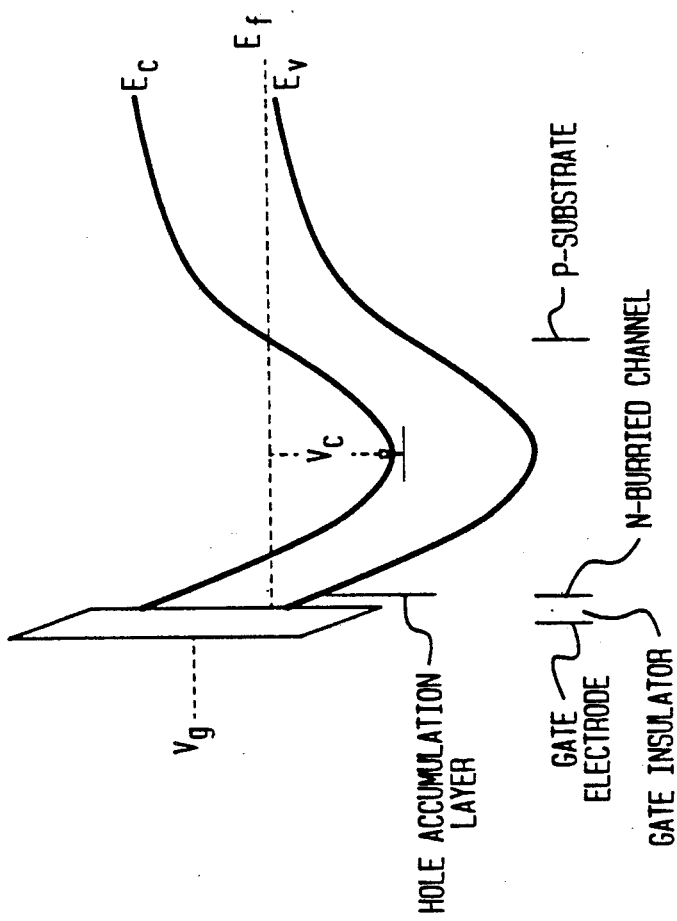
FIG. 5 is an electrostatic potential band diagram similar to FIG. 4 showing the mode of operation where holes are accumulated.

Referring to FIG. 5, there is shown an electrostatic potential band diagram for a mode of operation of the CCD sensor 18 here holes are accumulated at the Si—SiO$_2$ interface. FIG. 5 illustrates the condition of a sufficiently negative gate voltage such that holes are attracted to the Si—SiO$_2$ interface beneath the gate electrode. At even more negative gate voltages, $V_G$, the layer of holes shields the buried channel from the effects of the gate voltage. The gate is now accumulated with holes and the dark current drops to a low value. Thus, to operate the CCD sensor 18 in the above described mode, a negative potential is applied to both gates 30 and 32 of each pixel during the exposure time and during the horizontal read out time. However, during the transfer stage normal clocking of the gates 30 and 32 is used to transfer the charge carriers along the transfer channels 24. Dark current reduction of at least 50 times have been noted for the full accumulation mode operation at room temperature for true two phases, frame transfer CCD imagers.

Thus, in the camera system 10 of the present invention by having a CCD sensor 18 which is operated in the mode where holes are accumulated at the Si—SiO$_2$ interface at room temperature, a camera 12 is provided which operates at low data rates, 1 to 2.5 MHz, to reduce electronic noise and provide high dynamic range (10-14 bits). This enables the data to be read directly into the computer 16 without the need of an expensive frame buffer. At the same time, by operating in the this mode at room temperature, the dark current is reduced so as to achieve a good picture. Thus, there is provided a CCD camera system 10 which is simple in construction and therefore relatively inexpensive yet provides a good picture at room temperature with a direct feed of the data from the camera 12 to the computer 16.

It is to be appreciated and understood that the specific embodiments of the invention are merely illustrative of the general principles of the invention. Various modifications may be made consistent with the principles set forth. For example, other structures of CCD image sensors may be used as long as they can be operated in the above described mode. Also, if desired, an inexpensive frame buffer may be provided between the camera 12 and the computer 18.

What is claimed is:

1. A camera system comprising:
    a computer adapted to receive at an input thereof input data and to analyze the output signals of a CCD camera;
    a high resolution CCD camera having at least one million pixels and operating at a low data rate of between 1 and 2.5 MHz compatible with the input data rate of the computer, said camera having a CCD image sensor which is capable of operation in a mode where holes are accumulated at room temperature to reduce any dark current, and
    an A/D converter directly coupling an output of the CCD camera to the input of the computer.

2. The camera system of claim 1 in which the CCD image sensor is a two phase CCD having a pair of conductive gates for each pixel.

3. The camera system of claim 2 further comprising means for applying a negative voltage to all of the conductive gates during the exposure time of the CCD image sensor so that the CCD sensor operates to accumulate holes and thereby reduce the dark current generated in the sensor.

4. The camera system of claim 3 in which the CCD image sensor further comprises:
    a substrate of a semiconductor material having a surface; a plurality of spaced, parallel vertical channel regions in the substrate at said surface; and
    a plurality of conductive gates extending over and insulated from said substrate surface and extending transversely across the channel regions.

5. The camera system of claim 4, in which the conductive gates comprise a first set of the gates spaced along the length of the channel regions and a second set of gates alternating along said channel regions with said first set of gates, each pair of adjacent first and second gates defining a pixel of the channel regions, and each set of gates being connected to a separate voltage source to provide the two phases of the sensor.

* * * * *